(12) United States Patent
Yamane et al.

(10) Patent No.: US 11,102,911 B2
(45) Date of Patent: Aug. 24, 2021

(54) INVERTER DEVICE

(71) Applicant: Mitsubishi Electric Corporation, Tokyo (JP)

(72) Inventors: Hisakazu Yamane, Tokyo (JP); Takaaki Tanaka, Tokyo (JP); Fumino Suzuki, Tokyo (JP); Akihiro Sawada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/801,864

(22) Filed: Feb. 26, 2020

(65) Prior Publication Data

US 2021/0059072 A1 Feb. 25, 2021

(30) Foreign Application Priority Data

Aug. 23, 2019 (JP) .............................. JP2019-152595

(51) Int. Cl.
| | |
|---|---|
| *H05K 7/20* | (2006.01) |
| *H02K 5/18* | (2006.01) |
| *H02K 11/33* | (2016.01) |
| *H02M 7/00* | (2006.01) |
| *H02K 5/20* | (2006.01) |
| *B63H 20/32* | (2006.01) |

(52) U.S. Cl.
CPC .......... *H05K 7/20272* (2013.01); *H02K 5/18* (2013.01); *H02K 5/20* (2013.01); *H02K 11/33* (2016.01); *H02M 7/003* (2013.01); *B63H 20/32* (2013.01)

(58) Field of Classification Search
CPC .......... H05K 7/20272; H05K 7/20927; H05K 7/20418; H05K 7/20872; H02K 11/33; H02M 7/003; H01L 23/473
See application file for complete search history.

(56) References Cited

U.S. PATENT DOCUMENTS

| | | | | |
|---|---|---|---|---|
| 5,453,911 | A * | 9/1995 | Wolgemuth | ............... F28F 3/12 361/689 |
| 9,947,607 | B2 * | 4/2018 | Matsui | .................. H01L 23/367 |
| 2015/0021756 | A1* | 1/2015 | Adachi | ............... H01L 23/3672 257/714 |
| 2015/0163962 | A1 | 6/2015 | Suzuki et al. | |
| 2016/0270268 | A1 | 9/2016 | Suzuki et al. | |
| 2017/0055378 | A1* | 2/2017 | Zhou | .................. H05K 7/20927 |
| 2017/0182896 | A1* | 6/2017 | Masip | ..................... B60L 53/22 |

FOREIGN PATENT DOCUMENTS

WO 2014/041892 A1 3/2014

* cited by examiner

*Primary Examiner* — Mukundbhai G Patel
(74) *Attorney, Agent, or Firm* — Sughrue Mion, PLLC; Richard C. Turner

(57) ABSTRACT

Dew condensation in a housing of an inverter device can be prevented. The inverter device includes: a housing accommodating a power electronic element and an electrolytic capacitor; an opening formed in the housing; a thermal insulator disposed along a periphery of the opening; and a water jacket having a body portion, and a flow-in pipe and a discharge pipe for cooling water, the water jacket being disposed such that a first surface of the body portion closes the opening from an outside of the housing, with the thermal insulator interposed therebetween. The power electronic element is mounted on the first surface of the body portion, and the electrolytic capacitor is mounted in the housing so as to be in contact with an inner surface of the housing.

21 Claims, 12 Drawing Sheets

INVERTER DEVICE

BACKGROUND OF THE INVENTION

1. Field of the Invention

The present disclosure relates to an inverter device that is to be cooled using a water jacket.

2. Description of the Background Art

In a case where an AC motor is used with a DC power supply, DC current is converted into AC current using an inverter device, and the frequency and the current value of the AC current are adjusted, thereby controlling the rotation rate and the output (torque) of the AC motor.

In general, electrolytic capacitors and power electronic elements such as an FET (Field Effect Transistor) and an IGBT (Insulated Gate Bipolar Transistor) are used in inverter devices for converting DC current into AC current and adjusting the frequency and the current value of the AC current. In recent years, the conversion efficiencies of these inverter devices are so high as to be 90% or higher. Nonetheless, much energy is dissipated as heat without being converted.

If the temperature of any of the power electronic elements exceeds a performance assurance temperature owing to such heat generation, failure of the inverter device may result, and thus the power electronic elements need to be cooled using cooling water.

An inverter device has a housing formed by a case and a lid which closes the case, and power electronic elements and electrolytic capacitors are disposed on the bottom of the case which composes the housing.

A water jacket in which cooling water is caused to flow, is mounted to the outer surface of the housing of the inverter device. Heat generated from the power electronic elements and the electrolytic capacitors by driving the inverter device is cooled by causing cooling water to flow in the water jacket.

Broadly speaking, two cooling methods for an inverter device using a water jacket have been known. The first cooling method is a water circulation method in which cooling water is circulated while being cooled using a radiator. The second cooling method is a non-water circulation method in which seawater or lake water is used to cool the inverter device and is drained off immediately after the cooling.

In a case where an AC motor is used as a power source of an outboard engine or the like, the non-water circulation method has been employed as the cooling method for the inverter device since cooling water is easily obtained and the number of cooling devices such as a radiator can be reduced. Patent Document 1: WO2014/041892

If the non-water circulation method in which water collected from the sea, lake, or the like is directly used as cooling water is employed as the cooling method for devices such as conventional inverter devices for outboard engines, the temperature of cooling water sometimes significantly varies depending on the location at which the cooling water is collected.

When the temperature of collected cooling water is low and the inverter device is excessively cooled so that the temperature of air in the housing of the inverter device becomes lower than a dew-point temperature, dew condensation occurs in the housing of the inverter device. As a result, short-circuiting sometimes occurs among power electronic elements, and malfunction of the inverter device sometimes occurs.

SUMMARY OF THE INVENTION

The present disclosure has been made to solve the above problem, and an object of the present disclosure is to prevent dew condensation in a housing of an inverter device, thereby inhibiting short-circuiting in, and malfunction of, the inverter device.

An inverter device according to the present disclosure includes: a housing accommodating a power electronic element and an electrolytic capacitor; an opening formed in the housing; a thermal insulator disposed along a periphery of the opening; and a water jacket having a body portion, and a flow-in pipe and a discharge pipe for cooling water, the water jacket being disposed such that a first surface of the body portion closes the opening from an outside of the housing, with the thermal insulator interposed therebetween. The power electronic element is mounted on the first surface of the body portion, and the electrolytic capacitor is mounted in the housing so as to be in contact with an inner surface of the housing.

In the inverter device according to the present disclosure, the inside of the housing in which the power electronic element and the electrolytic capacitor are disposed can be prevented from being excessively cooled, and dew condensation in the housing of the inverter device can be prevented, whereby short-circuiting in, and malfunction of, the inverter device can be inhibited.

DETAILED DESCRIPTION OF THE PREFERRED EMBODIMENTS OF THE INVENTION

Figure 1:
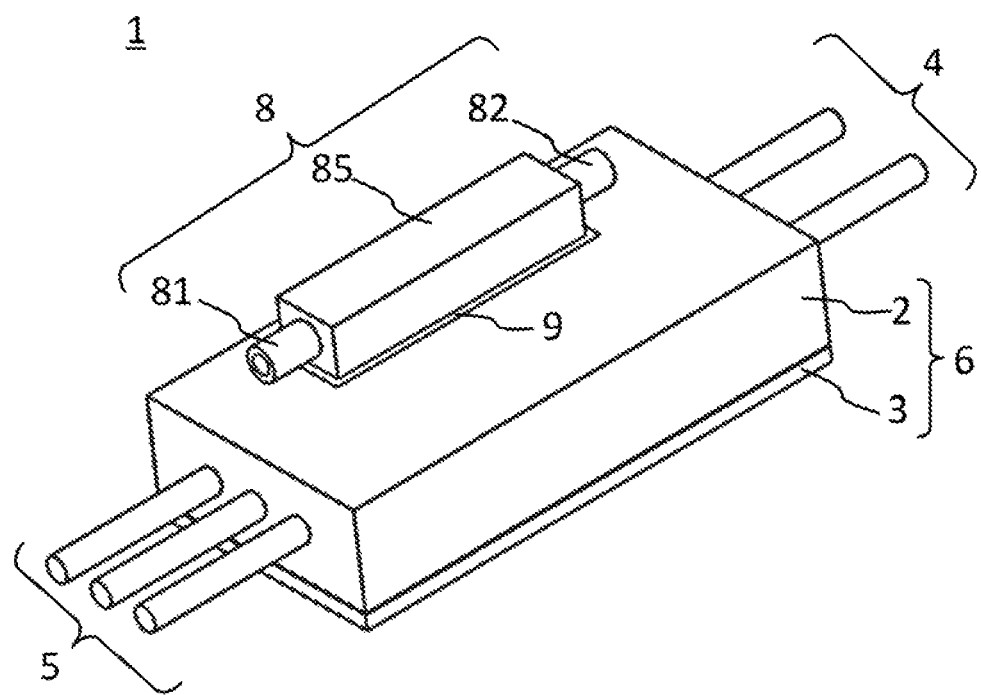
FIG. 1 is a perspective view of an inverter device according to a first embodiment.

In the description of the embodiments and the drawings, parts denoted by the same reference characters indicate identical or corresponding parts.

First Embodiment

Figure 2:
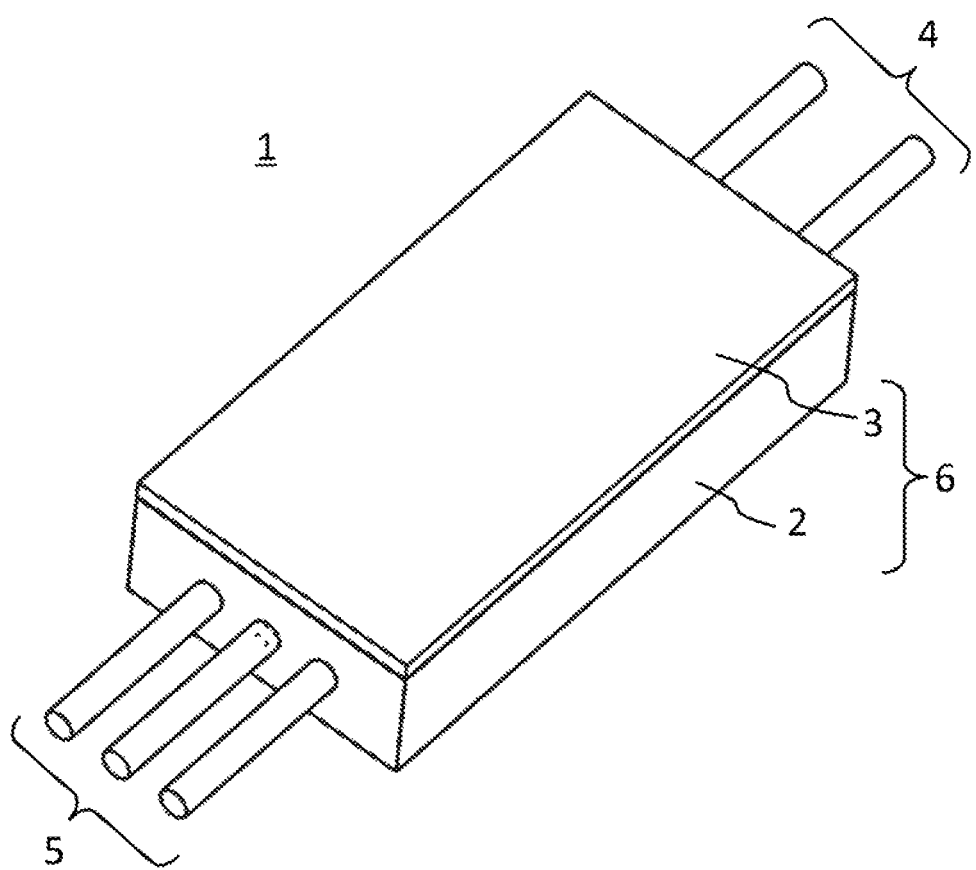
FIG. 2 is a perspective view of the inverter device according to the first embodiment as seen from the lower surface side thereof.
Figure 3:
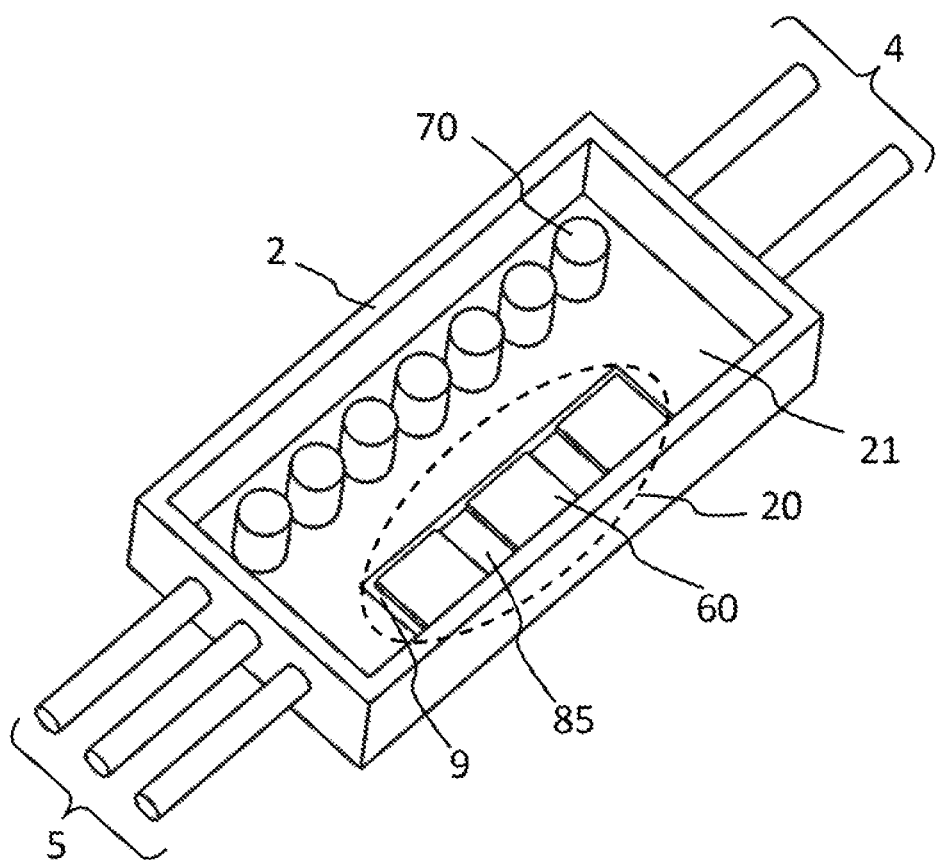
FIG. 3 is a view of the internal structure of the inverter device according to the first embodiment.

An inverter device 1 according to a first embodiment will be described with reference to FIG. 1 to FIG. 4. FIG. 1 is a perspective view of the inverter device 1 according to the present first embodiment. FIG. 2 is a perspective view of the inverter device 1 shown in FIG. 1 as seen from the lower surface side thereof. FIG. 3 is a perspective view of the internal structure of the inverter device 1 according to the present first embodiment.

Figure 4:
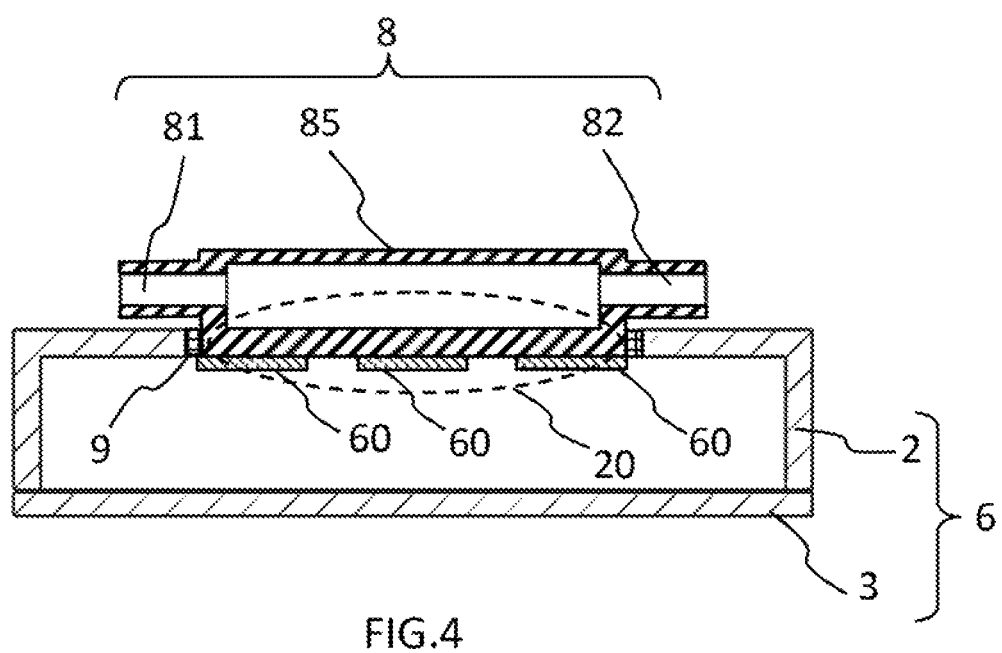
FIG. 4 is a sectional view of the inverter device according to the first embodiment.

FIG. 4 is a sectional view of the inverter device obtained by cutting, in the thickness direction, the inverter device shown in FIG. 1 along a plane including the center lines of a flow-in pipe 81 and a flow-out pipe 82 of a water jacket 8.

As shown in FIG. 1, a housing 6 of the inverter device 1 is formed by a case 2 and a lid 3 which closes the case 2.

FIG. 3 shows the internal structure with the lid 3 being detached. An opening 20 (enclosed by the broken line) is formed in the housing 6. Power electronic elements 60 for converting DC current to AC current, and electrolytic capacitors 70 for smoothing DC current, are disposed in the housing 6. In addition, each of AC power harnesses 5 for supplying AC power to an AC motor, and each of DC power harnesses 4 for supplying DC power to the inverter device 1, are respectively formed on both sides of the housing 6.

Each of the case 2 and the lid 3 which compose the housing 6 of the inverter device 1, is preferably formed of a metal material having high thermal conductivity such as aluminum or copper, and is formed of aluminum in the present first embodiment.

As shown in FIG. 1 and FIG. 4, a water jacket 8 for cooling the inverter device 1 using cooling water is mounted to the outer surface of the housing 6 of the inverter device 1. The water jacket 8 is a water-cooling device that is in close contact with a heat generation part and that cools the part by causing cooling water to flow in the water-cooling device. As shown in FIG. 1, the water jacket 8 is composed of a flow-in pipe 81 into which cooling water is introduced, a flow-out pipe 82 from which cooling water is discharged, and a metallic body portion 85 which is the body of the water jacket 8.

As is the housing 6 of the inverter device 1, the body portion 85 is suitably formed of a metal material having high thermal conductivity, and is formed of aluminum in the present first embodiment. However, the material is not limited thereto, and other metals and a plurality of materials different thereamong in thermal conductivity can also be used.

In the present first embodiment, as is known from the internal structure of the housing 6 shown in FIG. 3 and the sectional view shown in FIG. 4, the body portion 85 of the water jacket 8 is disposed so as to face the opening 20 (enclosed by the broken line) formed in the case 2, from the outside of the housing 6. A thermal insulator 9 is formed on the periphery of the opening 20 so that the case 2 and the body portion 85 of the water jacket 8 are located so as not to be in direct contact with each other.

The thermal insulator 9 is suitably formed of a material having low thermal conductivity such as resin or ceramic, and is formed of a resin material in the present first embodiment.

As shown in FIG. 3, the plurality of electrolytic capacitors 70 are disposed on a case bottom 21 in the housing 6 of the inverter device 1. In addition, the opening 20 (enclosed by the broken line) is formed in a part of the case bottom 21 as described above, and the power electronic elements 60 are disposed on the body portion 85, of the water jacket 8, which is exposed from the opening 20 to the inside of the housing 6.

It is noted that the case bottom 21 and each electrolytic capacitor 70 can be disposed so as to be in direct contact with each other or so as to have a cushioning member therebetween, and each power electronic element 60 and the body portion 85 of the water jacket 8 can be disposed so as to be in direct contact with each other or so as to have a cushioning member therebetween.

As shown in FIG. 4 and the like, the thermal insulator 9 is disposed on the periphery of the opening 20 formed in the case 2, and is used so as to fill the gap between the opening 20 and the body portion 85 of the water jacket 8. Therefore, the body portion 85 of the water jacket 8 and the case 2 of the housing 6 are not in direct contact with each other, and are thermally substantially insulated from each other.

The power electronic elements 60 which generate heat to the greatest extent in the inverter device 1 are mounted to the body portion 85 of the water jacket 8, and, when cooling water is caused to flow, high cooling efficiency is obtained.

On the other hand, each of other constituent components such as the electrolytic capacitors 70 is in direct contact with the case bottom 21 which is a part of the housing 6 of the inverter device 1, or is in indirect contact with the case bottom 21 with a cushioning member or the like therebetween, and is insulated, by the thermal insulator 9, from the water jacket 8 in which cooling water is used. Accordingly, the cooling effect of the water jacket 8 is not exerted to the other constituent components, and the other constituent components can be cooled only by means of so-called air-cooling that involves contact with surrounding air.

In the inverter device 1 according to the present first embodiment, the power electronic elements 60 which generate heat to great extents are subjected to water-cooling using the water jacket 8, and the other constituent components are subjected to air-cooling of which the cooling efficiency is not high. Accordingly, the inside of the housing 6 of the inverter device 1 is not excessively cooled. Thus, the inverter device 1 can be stably cooled even in a case where the non-water circulation method using, as cooling water, seawater or lake water of which the temperature significantly varies is employed as the cooling method.

The non-water circulation method as the cooling method is characterized also in that cooling water can be easily obtained and the number of cooling devices such as a radiator can be reduced. In the case where this method is employed in the inverter device 1 according to the present first embodiment, it is conceivable that, for example, the inverter device 1 is used in an outboard engine in which an AC motor is used as a power source.

Figure 5:
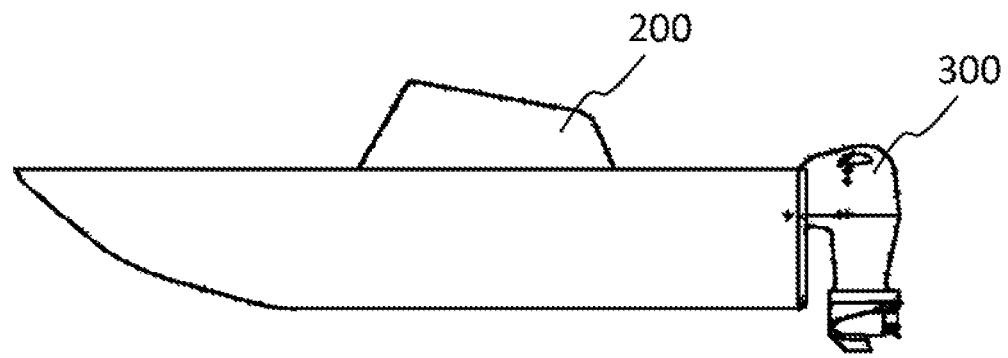
FIG. 5 is a schematic view of an outboard engine mounted to a boat, according to the first embodiment.
Figure 6:
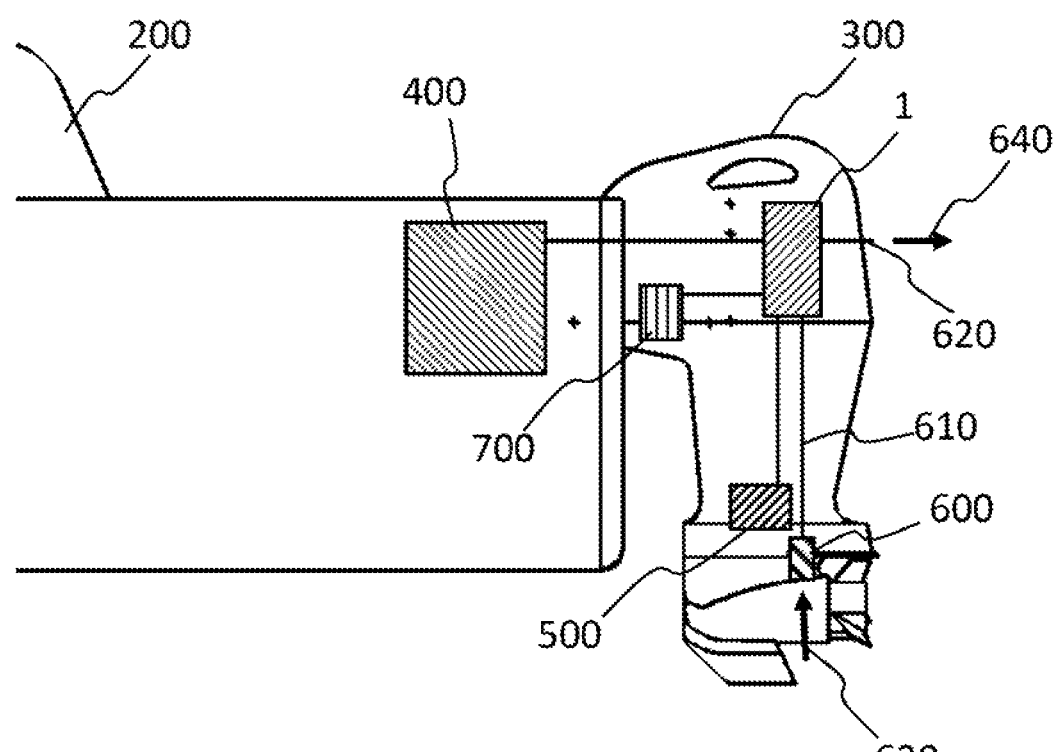
FIG. 6 is a view of the internal structure of the outboard engine according to the first embodiment.

FIG. 5 is a schematic view showing a state where an outboard engine 300 is mounted to a boat 200. FIG. 6 is an enlarged view of the internal structure of a part around the outboard engine 300.

The outboard engine 300 is mounted on the stern, and non-circulating water such as seawater is used for cooling the inverter device 1 and the like.

The inverter device 1 receives DC power from a battery 400 and converts the DC power into an AC signal, thereby performing control so as to drive a power AC motor 500. In the present first embodiment, the inverter device 1 is connected to an external electronic unit 700, and the output and the like of the inverter device 1 are controlled by the electronic unit 700.

Arrows 630 and 640 shown in FIG. 6 respectively indicate the flow of supply of cooling water and the flow of drainage of cooling water.

In the inverter device 1, seawater or the like pumped up by a pump 600 along the arrow 630 is taken into a water supply tube 610 as cooling water. Then, the cooling water is introduced into the water jacket 8 (not shown) mounted to the inverter device 1 so that the power electronic elements 60 (not shown) in the inverter device 1 are cooled. Thereafter, the cooling water passes through a drainage tube 620 and is drained off along the arrow 640 to the outside of the outboard engine 300 without circulating.

The other constituent components in the inverter device 1 are cooled by means of air-cooling.

As described above, in the inverter device 1 according to the present first embodiment, the power electronic elements 60 are cooled using cooling water with high efficiency, whereby the inverter device 1 can be prevented from failing owing to increase in the temperature thereof. Meanwhile, since the other constituent components such as the electrolytic capacitors 70 are cooled by means of air-cooling that involves contact with outside air, the other constituent components are not cooled to an outside air temperature or lower, and dew condensation is prevented from occurring, whereby short-circuiting in, and malfunction of, the inverter device 1 can be inhibited.

Second Embodiment

The first embodiment has the following configuration. Among the power electronic elements 60 and other constituent components such as the electrolytic capacitors 70 used in the inverter device 1, the power electronic elements 60 are cooled by the water jacket 8 using cooling water and the other constituent components are cooled by means of air-cooling, so that excessive cooling does not occur and dew condensation can be prevented. However, if non-circulating water such as seawater is used in the water jacket 8 and the temperature of the non-circulating water is considerably low, dew condensation may occur.

In general, a performance assurance temperature is predetermined for each power electronic element 60 used in the inverter device 1 or the like. If the temperature of the power electronic element 60 becomes the performance assurance temperature or higher, it is necessary to stop drive in order to prevent any malfunction. To this end, a temperature sensor for detecting the temperature of the power electronic element 60 is included in the power electronic element 60.

The amount of supply of cooling water is controlled based on the result of measurement by the temperature sensor. Specifically, if the temperature of the power electronic element 60 becomes lower than a certain preset temperature, determination that cooling is excessive is made, and control is performed so as to stop supply of cooling water to the water jacket 8 or make the amount of the supply small. Accordingly, the cooling is suppressed, and thus the internal temperature of the housing 6 of the inverter device 1 is maintained to be not lower than the outside air temperature, and dew condensation is prevented.

The cooling efficiency of the water jacket 8 is dependent on the amount of supply of cooling water flowing therein. In addition, if the same water path is assumed to be used, the cooling efficiency is greatly influenced by the flow rate. That is, the cooling efficiency is high when the flow rate is high, whereas the cooling efficiency is low and basically zero when a cooling water pump is stopped and the flow rate is set to zero.

In view of this dependence, the flow rate of cooling water is adjusted based on the temperature of the power electronic element 60 measured with the temperature sensor so that cooling by the water jacket 8 can be controlled, whereby dew condensation can be prevented even when the temperature of non-circulating water such as seawater considerably decreases.

Third Embodiment

In the second embodiment, description has been made regarding temperature control based on the temperature of each power electronic element 60 measured with the temperature sensor included in the power electronic element 60.

The present third embodiment is different in that an outside air temperature sensor is provided to the outside of the inverter device 1. By controlling the cooling water pump based on data of an outside air temperature acquired by the outside air temperature sensor, the temperature of the power electronic element 60 can be more finely adjusted, and dew condensation in the housing 6 of the inverter device 1 can be prevented.

Figure 7:
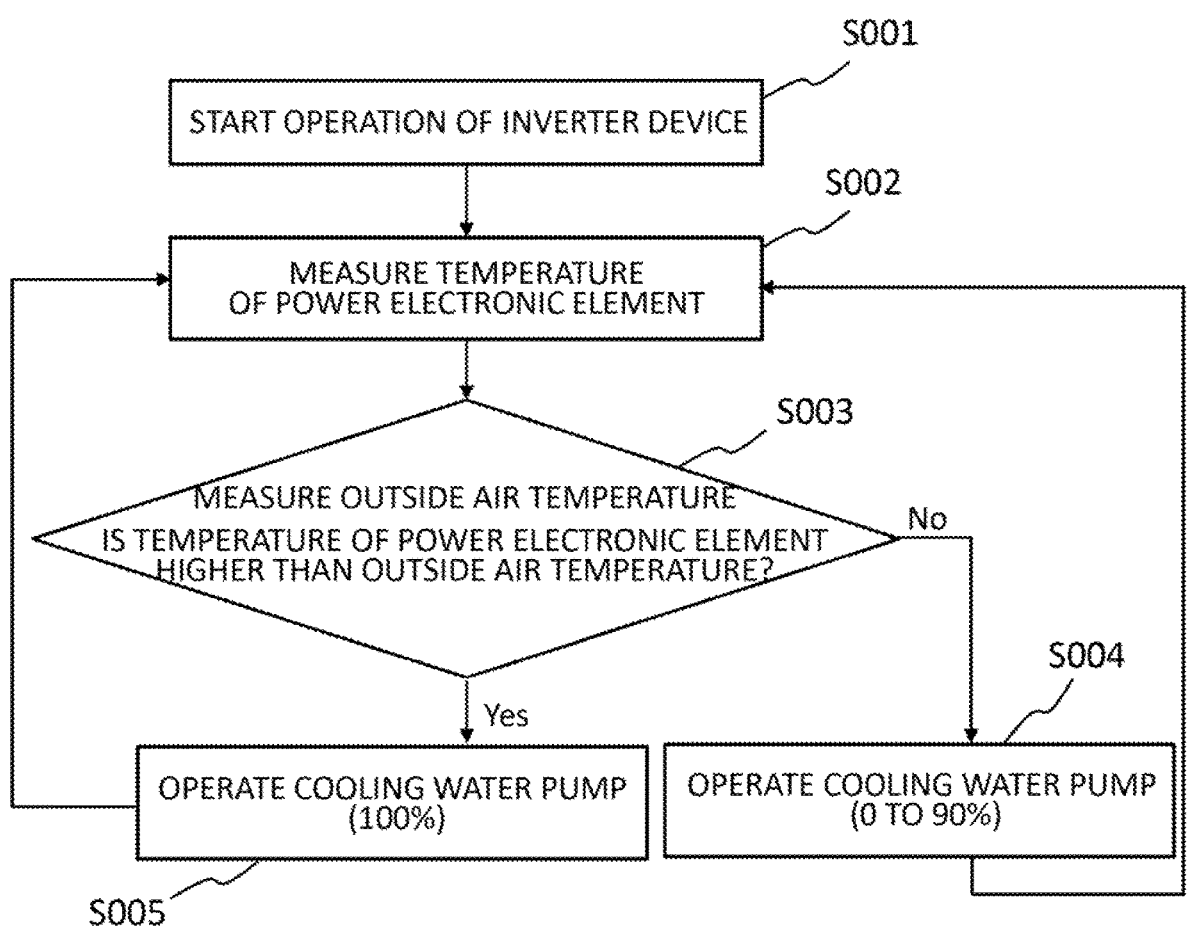
FIG. 7 is a flowchart of temperature control for an inverter device according to a third embodiment.

FIG. 7 indicates the flow of the temperature control for the inverter device 1 according to the present third embodiment.

<Step S001>

The operation of the inverter device 1 is started.

<Step S002>

Then, the temperature of the power electronic element 60 is measured by the temperature sensor.

<Step S003>

Data of an outside air temperature is acquired using the outside air temperature sensor provided to the outside of the inverter device 1.

The outside air temperature and the temperature of the power electronic element 60 are compared with each other, and determination is made as to whether or not the temperature of the power electronic element is higher than the outside air temperature.

If the temperature of the power electronic element 60 is lower, determination that the cooling is excessive is made, and the process proceeds to step S004. Meanwhile, if the temperature of the power electronic element 60 is higher, determination that the cooling is insufficient is made, and the process proceeds to step S005.

<Step S004>

If the temperature of the power electronic element 60 is lower, the cooling water pump is operated so as to adjust the output of the cooling water pump to fall within 0 to 90%.

<Step S005>If the temperature of the power electronic element 60 is higher, the cooling water pump is operated so as to further perform the cooling with the output being set to 100%.

If the flow of the temperature control from step S001 to step S005 is performed in the inverter device 1, the temperature of the power electronic element 60 can be prevented from becoming lower than the outside air temperature, and dew condensation in the housing 6 of the inverter device 1 can be prevented.

If it is difficult to continuously control the output of the cooling water pump to be 0 to 90%, control may be performed so as to switch the operation of the cooling water pump between ON and OFF, whereby the same result can be obtained. In this case, for example, if the temperature of the power electronic element 60 is lower than the outside air temperature, the operation of the cooling water pump is stopped (OFF), and, if the temperature of the power electronic element 60 is higher, the operation is started (ON), whereby the temperature control can be easily performed.

Fourth Embodiment

The basic configuration of an inverter device 1 according to the present fourth embodiment is the same as that in the first embodiment, but is characterized by being different therefrom in the structure of the water jacket 8.

Figure 8A:
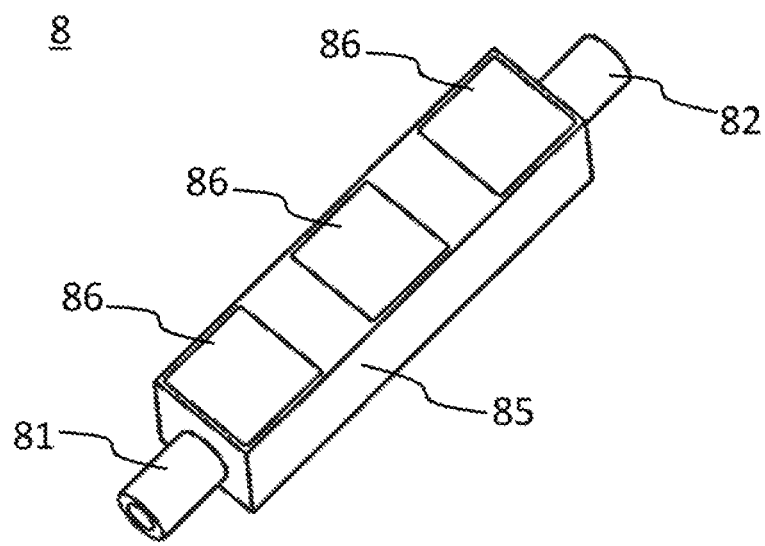
FIG. 8A is a perspective view of a water jacket according to a fourth embodiment.
Figure 8B:
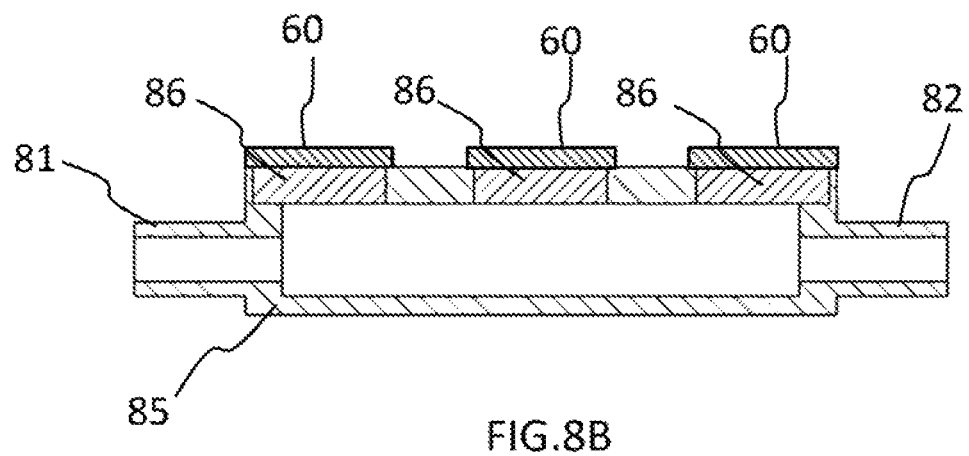
FIG. 8B is a sectional view of the water jacket according to the fourth embodiment.

FIG. 8A is a perspective view of the water jacket 8 used in the present fourth embodiment, and shows a state where a surface thereof in which cooling plates 86 described later are disposed, faces upward. FIG. 8B is a sectional view of the water jacket 8 obtained by cutting, in the thickness direction, the water jacket 8 shown in FIG. 8A along a plane including the center lines of the flow-in pipe 81 and the flow-out pipe 82.

In the present fourth embodiment, the cooling plates 86 for mounting thereon the power electronic elements 60 are disposed in a part of the body portion 85 of the water jacket 8.

The entirety of the water jacket 8 of the inverter device 1 used in any of the first embodiment and the like is formed of a metal material having excellent thermal conductivity such as aluminum. However, in the present fourth embodiment, a major part of the body portion 85 is formed of a resin material, and each cooling plate 86 which composes a part of the body portion 85 is formed of a metal material having excellent thermal conductivity.

The cooling plate 86 enables more local cooling, and thus is preferably substantially as large as the corresponding power electronic element 60 or preferably has a size not exceeding the size of the power electronic element 60.

The cooling plate 86 is preferably formed of a metal material having excellent thermal conductivity such as aluminum or copper, and is formed of a copper material in the present fourth embodiment.

Since the body portion 85 of the water jacket 8 is formed of a resin material and the metallic cooling plates 86, the part formed of the resin material can be easily molded and the weight can be reduced. In addition, since the metallic cooling plates 86 are used, local cooling is enabled.

By using the water jacket 8 of the present fourth embodiment, only the parts that are necessary to be cooled can be locally cooled, and thus the entirety of the inside of the housing 6 of the inverter device 1 is not excessively cooled, and dew condensation can be prevented.

Fifth Embodiment

The basic configuration of an inverter device 1 according to the present fifth embodiment is the same as that in the first embodiment, but is characterized in that fins 22 are formed on a part of the outer surface of the housing 6 of the inverter device 1 in order to cool the electrolytic capacitors 70.

Figure 9:
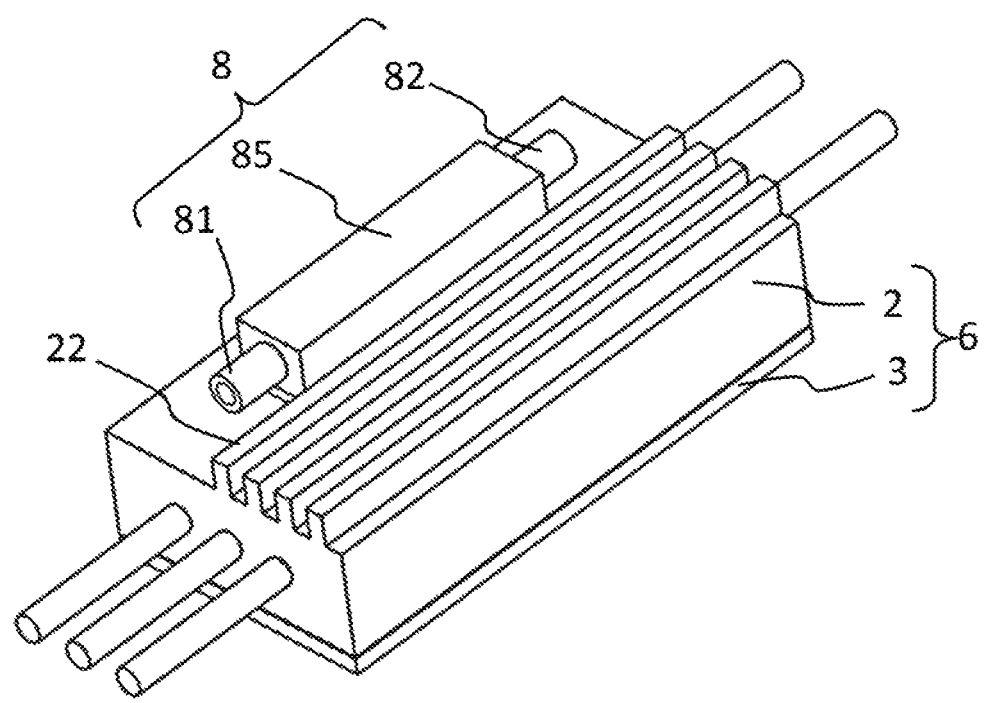
FIG. 9 is a perspective view of an inverter device according to a fifth embodiment.

FIG. 9 shows a perspective view of the inverter device 1 according to the present fifth embodiment.

In the first embodiment, although the power electronic elements 60 can be locally cooled using the water jacket 8, each electrolytic capacitor 70 is disposed in the case 2 so as to be in direct contact with the inner surface of the case 2 or in indirect contact with the inner surface with a cushioning member or the like therebetween, and can be cooled only by means of air-cooling that involves heat dissipation from the flat outer surface of the case 2.

When the output of an operated power motor is low, it is not particularly necessary to take into consideration cooling efficiency for the electrolytic capacitors 70 and the like. If the case 2 is formed of a metal material having high thermal conductivity, increases in the temperatures of the electrolytic capacitors 70 are sufficiently suppressed by means of air-cooling from the flat outer surface.

However, when the output of the power motor is high, the output of the inverter device 1 needs to be high, and it is necessary to also take into consideration increases in the temperatures of constituent components other than the power electronic elements 60, such as the electrolytic capacitors 70.

The present fifth embodiment is characterized in that the fins 22 are provided as shown in FIG. 9 in order to increase the cooling efficiency of air-cooling in the region of the case 2 when such a high-output inverter device 1 is used.

The shape of each fin 22 in the present fifth embodiment is the shape of a plate as in FIG. 9. However, the shape of the fin 22 is not limited thereto, and a so-called pin fin having the shape of a circular column may be used as long as the area of contact with ambient air is made large.

In addition, although FIG. 9 shows a view in which the fins 22 are formed on the outer surface of the case 2, the same advantageous effects can be obtained even if the fins 22 are formed on the outer surface of the lid 3 which closes the case 2.

The inverter device 1 according to the present fifth embodiment can be prevented from failing owing to increases in the temperatures of the power electronic elements 60. In addition, the other constituent components such as the electrolytic capacitors 70 are cooled by means of air-cooling that involves contact with outside air, and thus are not cooled to the outside air temperature or lower, and dew condensation is prevented from occurring, thereby inhibiting short-circuiting in, and malfunction of, the inverter device 1.

At the same time, since the fins 22 are formed on the outer surface of the housing 6, the constituent components such as the electrolytic capacitors 70 can be sufficiently cooled even when the output of the inverter device 1 is high.

Sixth Embodiment

The basic configuration of an inverter device 1 according to the present sixth embodiment is the same as the configuration described in the fifth embodiment in which the fins 22 are formed on the outer surface of the housing 6, but is different in that an eave portion 84 extending from the body portion 85 of the water jacket 8 is provided in order to further increase the cooling efficiency for the electrolytic capacitors 70.

Figure 10A:
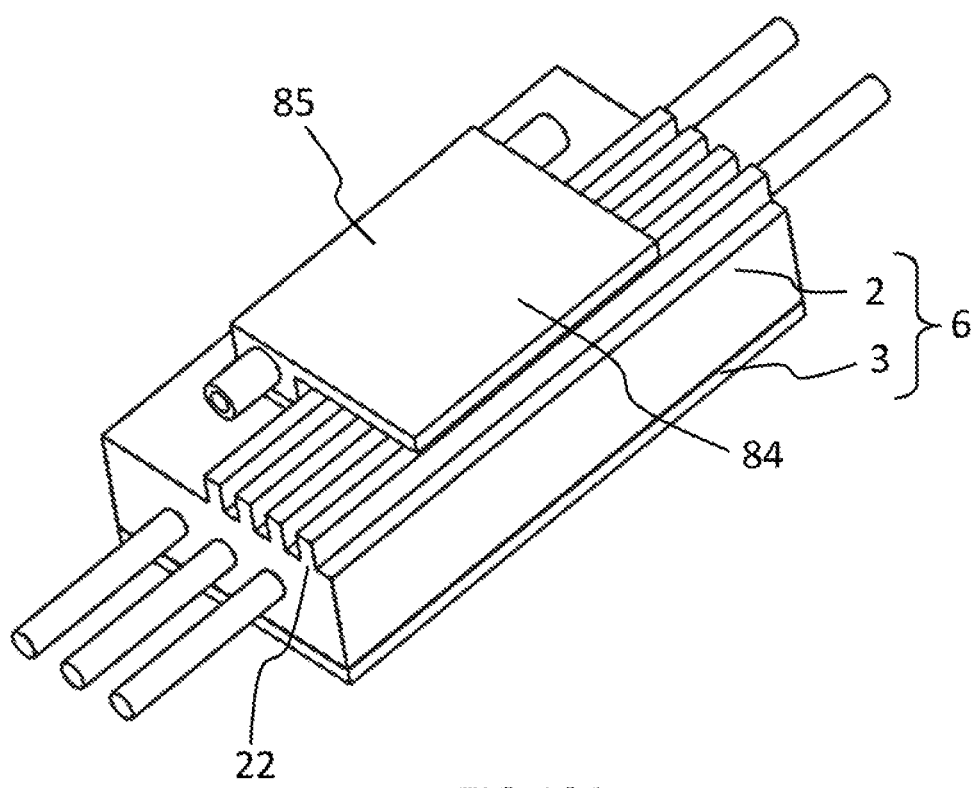
FIG. 10A is a perspective view of an inverter device according to a sixth embodiment.
Figure 10B:
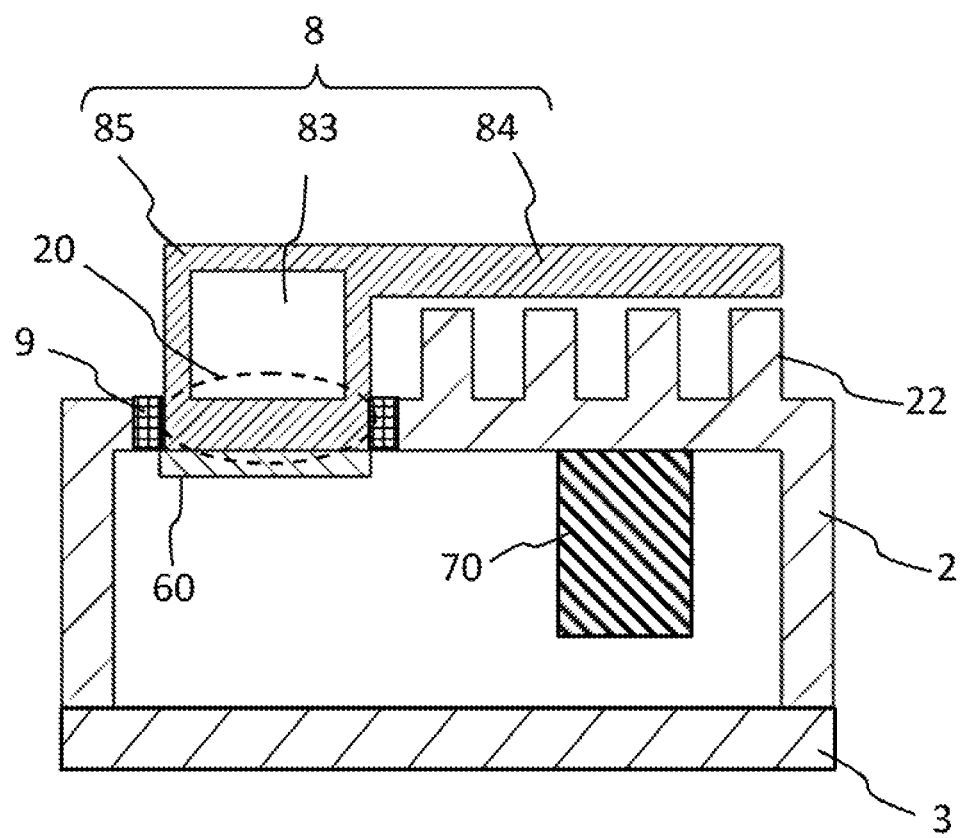
FIG. 10B is a sectional view of the inverter device according to the sixth embodiment.

FIG. 10A shows a perspective view of the inverter device 1 according to the present sixth embodiment. FIG. 10B shows a sectional view obtained by cutting a center part of the inverter device 1 along a plane perpendicular to the center lines of the flow-in pipe 81 and the flow-out pipe 82.

As shown in FIG. 10A and FIG. 10B, the fins 22 are formed on the outer surface of the housing 6 of the inverter device 1 as in the fifth embodiment. In addition, the eave portion 84 extending from the body portion 85 of the water jacket 8 is formed such that the gap from the fins 22 is maintained to be even and the eave portion 84 covers the fins 22.

As seen from the sectional view of the inverter device 1 in FIG. 10B, each electrolytic capacitor 70 is disposed on the inner surface of the case 2 of the inverter device 1, and the fins 22 are formed on a surface, of the case 2, that is opposite to the portion on which the electrolytic capacitor 70 is mounted.

Each power electronic element 60 is disposed so as to be in contact with the water jacket 8. Therefore, the power electronic element 60 of which the temperature is increased owing to the operation of the inverter device 1, is cooled with cooling water flowing through a water path 83 in the water jacket 8.

The water jacket 8 is disposed in the opening 20 (enclosed by the broken line) formed in the case 2 which composes the housing 6 of the inverter device 1, with the thermal insulator 9 interposed therebetween. Therefore, constituent components other than the power electronic elements 60, e.g. the electrolytic capacitors 70, are thermally insulated from the water jacket 8, and thus the cooling effect of the water jacket 8 is not exerted to such constituent components. The electrolytic capacitors 70 are cooled by means of air-cooling from the surface of the case 2 and the fins 22 formed on the case 2.

On the other hand, the fins 22 are covered by the eave portion 84 extending from the water jacket 8. The eave portion 84 and air therearound are cooled owing to the cooling effect of the water jacket 8. As a result, heat dissipation from the fins 22 and the surface of the case 2 is facilitated, whereby the constituent components such as the electrolytic capacitors 70 are cooled.

In the present sixth embodiment, it is important that each fin 22 formed on the case 2 and the eave portion 84 extending from the water jacket 8 are not in contact with each other and an even gap is maintained therebetween. If the fin 22 and the eave portion 84 are in contact with each other, it is assumed that the constituent components such as the electrolytic capacitors 70 are excessively cooled and the internal temperature of the housing 6 excessively decreases, whereby dew condensation may occur.

In the above example, the even gap between the fin 22 and the eave portion 84 is implemented by air. However, a cushioning member having an appropriate thermal conductivity may be interposed therebetween to practice the present sixth embodiment.

As described above, the inverter device 1 according to the present sixth embodiment can be prevented from failing owing to increases in the temperatures of the power electronic elements 60. In addition, the other constituent components such as the electrolytic capacitors 70 are cooled by means of air-cooling that involves contact with outside air, and thus are not cooled to the outside air temperature or lower, and dew condensation is prevented from occurring, whereby malfunction and the like of the inverter device 1 are inhibited.

At the same time, since the fins 22 and the eave portion 84 extending from the water jacket 8 are provided to the outer surface of the housing 6, the constituent components such as the electrolytic capacitors 70 can be sufficiently cooled even when the output of the inverter device 1 is high.

Seventh Embodiment

In the first to sixth embodiments, the thermal insulator 9 formed of a material having low thermal conductivity such as resin or ceramic is disposed along the opening 20 formed in the case 2, and the water jacket 8 is disposed so as to face the opening 20, with the thermal insulator 9 interposed therebetween.

In the present seventh embodiment, an air space 10 is formed between the opening 20 and the water jacket 8 without disposing resin, ceramic, or the like as the thermal insulator 9 along the opening 20.

The inverter device 1 having this configuration is applicable in an environment where the inverter device 1 can be used even though not being waterproof.

Figure 11A:
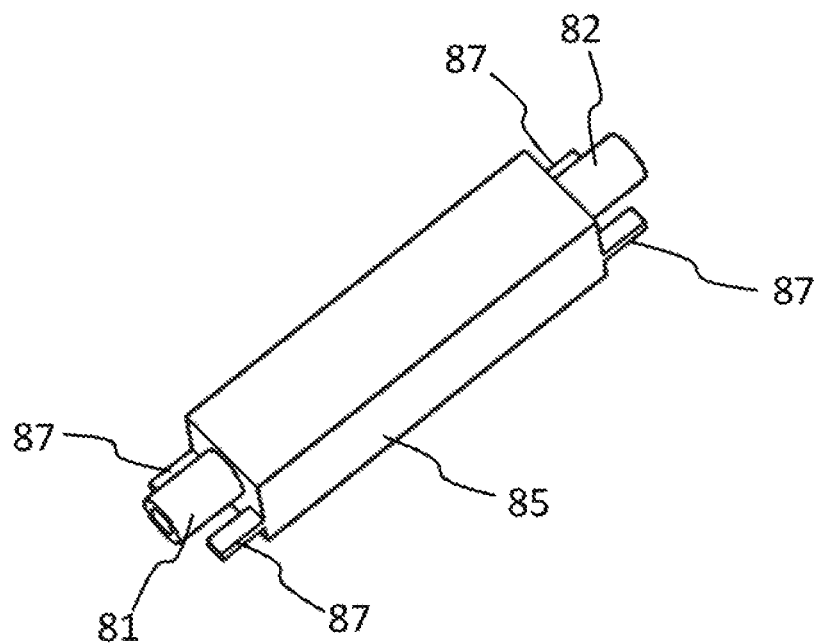
FIG. 11A is a perspective view of a water jacket according to a seventh embodiment.
Figure 11B:
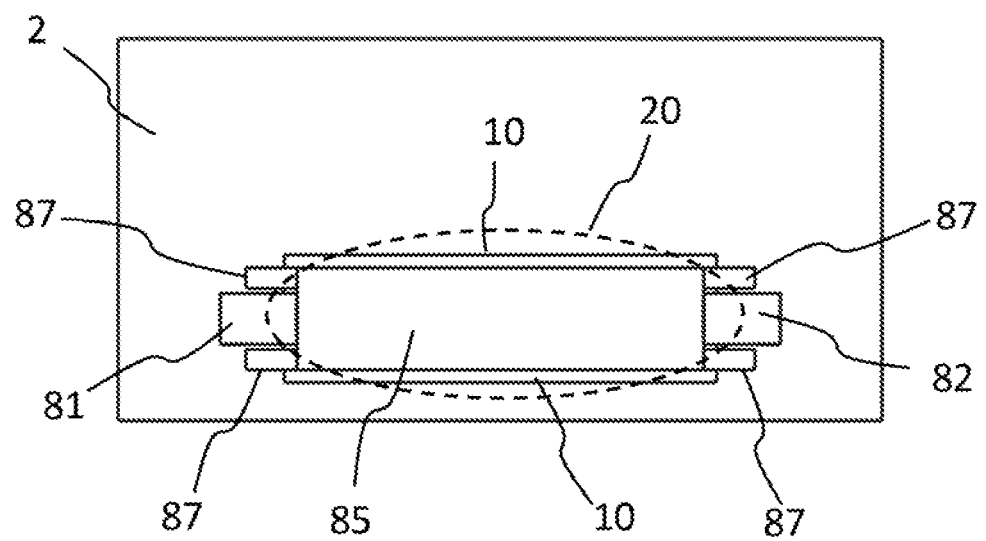
FIG. 11B is a plan view of an inverter device according to the seventh embodiment.

FIG. 11A shows a perspective view of a water jacket 8 in the present seventh embodiment, and FIG. 11B shows a plan view of an inverter device 1 having the water jacket 8 mounted thereto.

As shown in FIG. 11A, the water jacket 8 basically has the same shape as that of the water jacket 8 used in any of the other embodiments. However, the water jacket 8 in the present seventh embodiment is characterized by having flanges 87 at the four corners thereof such that the water jacket 8 can be disposed in the opening 20 in the case 2 without using the thermal insulator 9.

In the present seventh embodiment, two of the flanges 87 are respectively disposed on the left and the right of each of the flow-in pipe 81 and the flow-out pipe 82 of the water jacket 8 as shown in FIG. 11A.

The arrangement and the number of the flanges 87 are not limited thereto, and the flanges 87 can be used with the arrangement and the number thereof being changed according to the size and the shape of the opening 20, and the like.

As shown in the plan view in FIG. 11B, the water jacket 8 is disposed in the opening 20 (enclosed by the broken line) and fixed such that the flanges 87 serve as bridges. The fixation can be performed by means of screws, an adhesive, or the like.

In the configuration of the present seventh embodiment, thermal conduction between the case 2 and the water jacket 8 can be suppressed without using the thermal insulator 9 owing to the air space 10. In addition, although this configuration is limited in use to the environment not requiring waterproofness, this configuration allows the inverter device 1 to be obtained with a simple structure.

Figure 12:
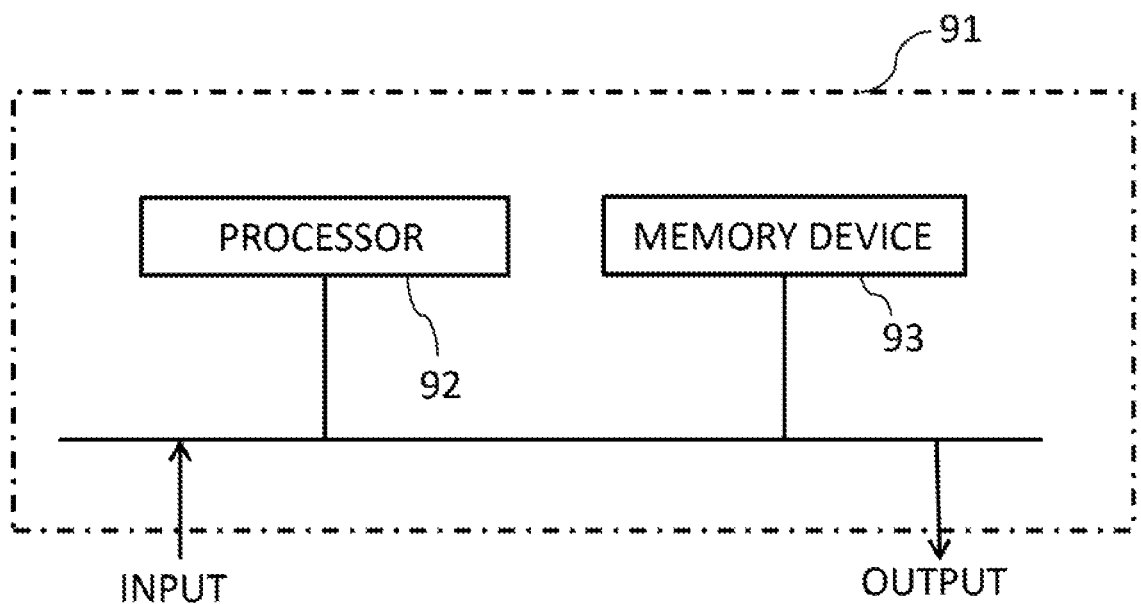
FIG. 12 is a diagram of hardware for the temperature control according to the second and third embodiments.

FIG. 12 shows an example of hardware 91 for performing computation such as comparison between the outside air temperature and the temperature of each power electronic element 60 and control of the cooling water pump, in the embodiments of the present disclosure.

As shown in FIG. 12, the hardware 91 is composed of a processor 92 and a memory device 93. Although not shown, the memory device includes a volatile memory device such as a random access memory, and a nonvolatile auxiliary memory device such as a flash memory. Alternatively, the memory device may include, as the auxiliary memory device, a hard disk instead of a flash memory. The processor 92 executes a program inputted from the memory device 93. In this case, the program is inputted from the auxiliary memory device via the volatile memory device to the processor 92. In addition, the processor 92 may output data such as a computation result to the volatile memory device of the memory device 93 or may save the data in the auxiliary memory device via the volatile memory device.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 inverter device
2 case
3 lid
4 DC power harness
5 AC power harness
6 housing
8 water jacket
9 thermal insulator
10 air space
20 opening
21 case bottom
22 fin
60 power electronic element
70 electrolytic capacitor
81 flow-in pipe
82 flow-out pipe
83 water path
84 eave portion
85 body portion
86 cooling plate
87 flange
91 hardware
92 processor
93 memory device
200 boat
300 outboard engine
400 battery
500 power AC motor
600 pump
610 water supply tube
620 drainage tube
630 arrow
640 arrow
700 electronic unit

What is claimed is:

1. An inverter device comprising:
a processor;
a housing accommodating a power electronic element and an electrolytic capacitor;
an opening formed in the housing;
a thermal insulator disposed along a periphery of the opening; and
a water jacket having a body portion, and a flow-in pipe and a discharge pipe for cooling water, wherein
the power electronic element is mounted on a first surface of the body portion, and
the electrolytic capacitor is mounted in the housing so as to be in contact with an inner surface of the housing,
wherein the processor is configured to control an amount of supply of cooling water to the water jacket according to a temperature of the power electronic element, wherein the processor is further configured to both water-cool the power electronic element when an inverter device output power is high and to avoid an air-cooling of the electrolytic capacitor below a dew point.

2. The inverter device according to claim 1, wherein the thermal insulator is formed of resin or ceramic.

3. The inverter device according to claim 2, wherein the body portion is formed of materials that are different in thermal conductivity, and the power electronic element is mounted on a part, of the body portion, that is formed of the material having a higher thermal conductivity.

4. The inverter device according to claim 2, wherein a metallic cooling plate having a size that does not exceed a size of the power electronic element is disposed in a part, of the body portion, on which the power electronic element is mounted.

5. The inverter device according to claim 2, wherein a fin for heat dissipation is formed on an outer surface of the housing.

6. The inverter device according to claim 5, wherein the fin has a shape of a plate or a circular column.

7. The inverter device according to claim 1, wherein the thermal insulator is an air space.

8. The inverter device according to claim 7, wherein the body portion is formed of materials that are different in thermal conductivity, and the power electronic element is mounted on a part, of the body portion, that is formed of the material having a higher thermal conductivity.

9. The inverter device according to claim 7, wherein a metallic cooling plate having a size that does not exceed a size of the power electronic element is disposed in a part, of the body portion, on which the power electronic element is mounted.

10. The inverter device according to claim 7, wherein a fin for heat dissipation is formed on an outer surface of the housing.

11. The inverter device according to claim 10, wherein the fin has a shape of a plate or a circular column.

12. The inverter device according to claim 1, wherein the body portion is formed of materials that are different in thermal conductivity, and the power electronic element is mounted on a part, of the body portion, that is formed of the material having a higher thermal conductivity.

13. The inverter device according to claim 1, wherein a metallic cooling plate having a size that does not exceed a size of the power electronic element is disposed in a part, of the body portion, on which the power electronic element is mounted.

14. The inverter device according to claim 1, wherein a fin for heat dissipation is formed on an outer surface of the housing.

15. The inverter device according to claim 14, wherein the fin has a shape of a plate or a circular column.

16. The inverter device according to claim 1, wherein supply of cooling water is stopped or the amount of the supply is reduced if the temperature of the power electronic element becomes lower than an outside air temperature.

17. The inverter device according to claim 1, wherein the electrolytic capacitor is mounted on an inside face of a first portion of the body, wherein an outside face of the first portion of the body includes a plurality of fins, and wherein the plurality of fins are configured to assist in air-cooling the electrolytic capacitor to a temperature near ambient temperature.

18. The inverter device according to claim 17, wherein the body includes an eave, and the eave is disposed near the plurality of fins and without touching the plurality of fins.

19. The inverter device according to claim 1, wherein the processor is further configured to control the supply of cooling water so as to avoid a short circuit within the housing due to an undesired dew formation on the electrolytic capacitor.

20. An inverter device comprising:
a housing accommodating a power electronic element and an electrolytic capacitor;
an opening formed in the housing;
a thermal insulator disposed along a periphery of the opening; and
a water jacket having a body portion, and a flow-in pipe and a discharge pipe for cooling water, wherein
the power electronic element is mounted on a first surface of the body portion, and
the electrolytic capacitor is mounted in the housing so as to be in contact with an inner surface of the housing,
wherein a fin for heat dissipation is formed on an outer surface of the housing, and
an eave portion is formed so as to extend from the body portion and cover the fin without being in contact with either of the fin and the housing.

21. The inverter device according to claim 20, wherein the fin has a shape of a plate or a circular column.

* * * * *